US008837810B2

(12) United States Patent
Chen et al.

(10) Patent No.: US 8,837,810 B2
(45) Date of Patent: Sep. 16, 2014

(54) SYSTEM AND METHOD FOR ALIGNMENT IN SEMICONDUCTOR DEVICE FABRICATION

(75) Inventors: Yen-Liang Chen, Zhubei (TW);
Te-Chih Huang, Chu-Bei (TW);
Chen-Ming Wang, Kaohsiung (TW);
Chih-Ming Ke, Hsinchu (TW);
Tsai-Sheng Gau, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 224 days.

(21) Appl. No.: 13/431,668

(22) Filed: Mar. 27, 2012

(65) Prior Publication Data

US 2013/0259358 A1    Oct. 3, 2013

(51) Int. Cl.
*G06K 9/68*    (2006.01)

(52) U.S. Cl.
USPC ............. 382/149; 382/144; 382/151; 438/16; 438/401

(58) Field of Classification Search
CPC ...................... G06T 2207/30148; G06T 7/001; G06T 7/0044; G03F 1/84
USPC ...................... 382/149, 144, 151; 438/16, 401
See application file for complete search history.

(56) References Cited

U.S. PATENT DOCUMENTS

| 5,877,036 A | * | 3/1999 | Kawai ............................ 438/16 |
| 7,391,513 B2 | | 6/2008 | Van Der Schaar et al. |
| 7,808,643 B2 | | 10/2010 | Smith et al. |
| 2006/0280357 A1 | * | 12/2006 | Seligson et al. ............. 382/144 |
| 2007/0105029 A1 | | 5/2007 | Ausschnitt |
| 2009/0291513 A1 | * | 11/2009 | Ghinovker et al. ............. 438/16 |

OTHER PUBLICATIONS

Mike Adel, Mark Ghinovker, Boris Golovanesky, Pavel Izikson, Elyakim Kassel, Dan Yaffe, Alfred M. Bruckstein, Roman Goldenberg, Yossi Rubner and Michael Rudzsky; "Optimized Overlay Metrology Marks: Theory and Experiment;" pp. 166-179; vol. 17; No. 2; May 2004; IEEE Transactions on Semiconductor Manufacturing.

* cited by examiner

*Primary Examiner* — Ruiping Li
(74) *Attorney, Agent, or Firm* — Haynes and Boone, LLP

(57) ABSTRACT

A method of determining overlay error in semiconductor device fabrication includes receiving an image of an overlay mark formed on a substrate. The received image is separated into a first image and a second image, where the first image includes representations of features formed on a first layer of the substrate and the second image includes representations of the features formed on a second layer of the substrate. A quality indicator is determined for the first image and a quality indicator is determined for the second image. In an embodiment, the quality indicators include asymmetry indexes.

20 Claims, 14 Drawing Sheets

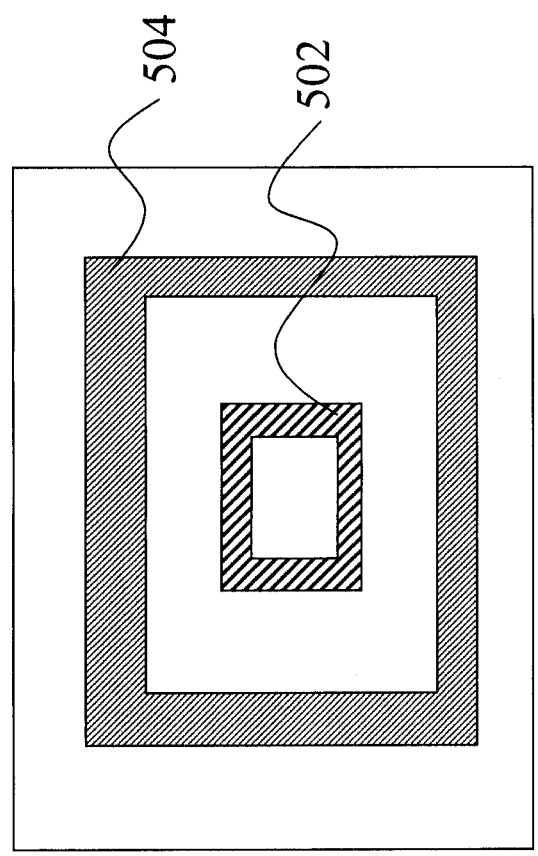
Fig. 5

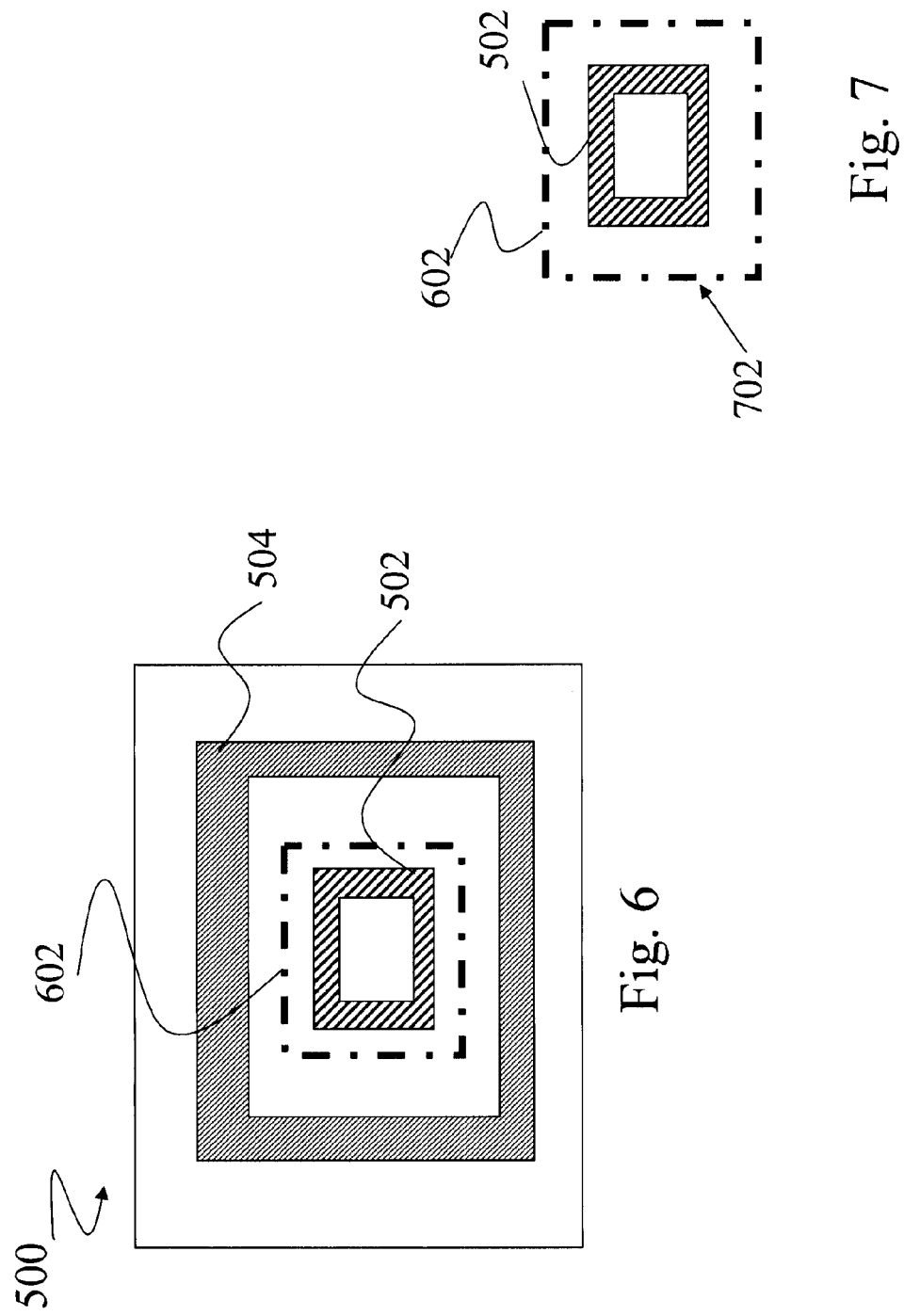

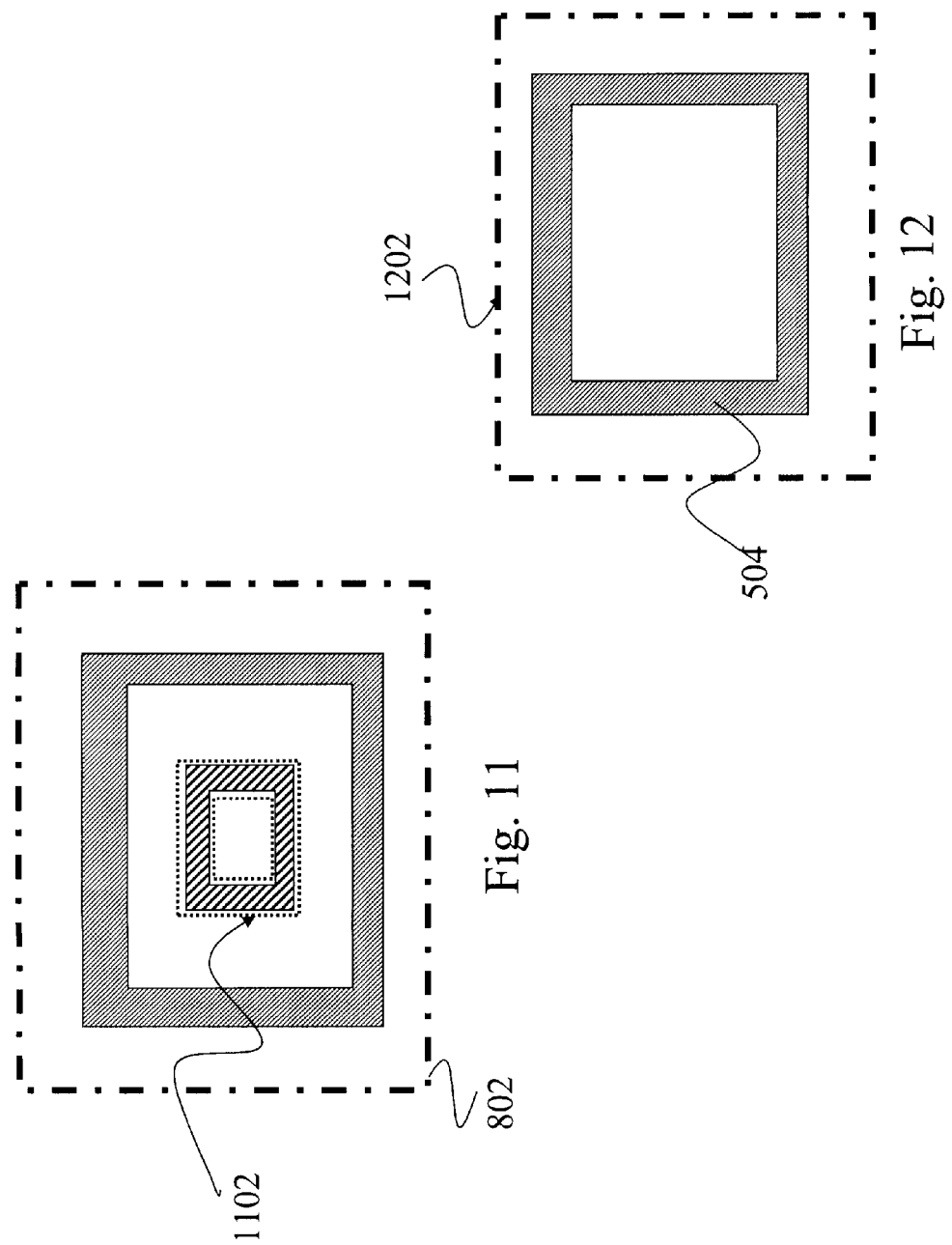

SYSTEM AND METHOD FOR ALIGNMENT IN SEMICONDUCTOR DEVICE FABRICATION

BACKGROUND

Semiconductor devices are fabricated by creating a sequence of patterned and un-patterned layers where the features on patterned layers are spatially related to one another. Thus during fabrication, each patterned layer must be aligned with a previous patterned layer, and as such, the overlay between a first layer and a second layer must be taken into account. The overlay is the relative position between two or more layers of a semiconductor substrate such as, for example, a wafer. As semiconductor processes evolve to provide for smaller critical dimensions, and devices reduce in size and increase in complexity including number of layers, the alignment precision between layers becomes increasingly more important to the quality, reliability, and yield of the devices. The alignment precision is measured as overlay offset or overlay error, or the distance and direction a layer is offset from precise alignment with a previous layer. Misalignment of layers can cause performance issues and even potentially causing a device to fail due to, for example, a short caused by a misaligned interconnect layer.

Therefore, it is desired to accurately and efficiently measure the overlay offset between layers during processing to allow for possible correction. Current overlay metrology uses optically readable target marks or alignment marks printed onto layers of a semiconductor wafer during fabrication. The relative displacement of the marks is measured by irradiating the marks to measure the misregistration. As semiconductor devices decrease in dimensions this can become more challenging. Thus, what is desired are systems and methods that provide for accurate and efficient measurement of overlay error in semiconductor fabrication.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 5, 6, 7, 8, 9, 10a, 11, and 12 are top views of images provided in one or more steps of the method of FIG. 3.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. Further, for ease of reference, a representative overlay mark is illustrated in one or more of the accompanying figures. However, any configuration of overlay mark including but not limited to frame-in-frame, box-in-box, box-in-frame, cross-in-frame, grating marks, etc, may be used in the present systems and methods.

Figure 1:
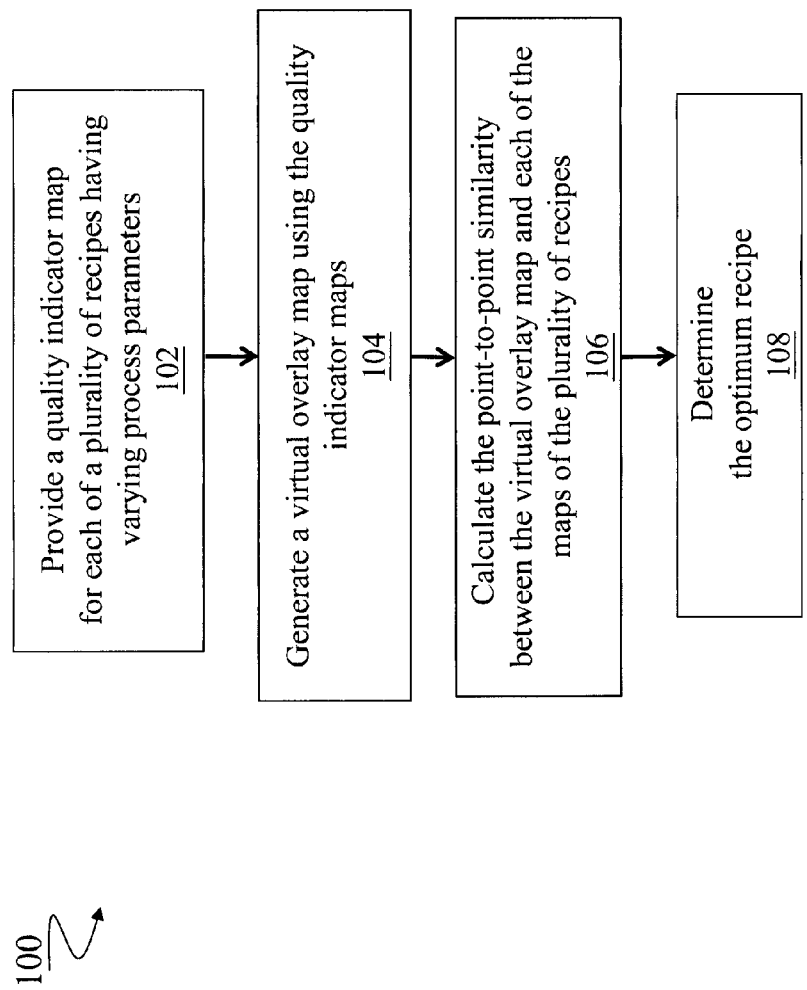
FIG. 1 is a flow chart illustrating an embodiment of a method of determining an overlay measurement process parameter according to one or more aspects of the present disclosure.

Illustrated in FIG. 1 is a flow chart of a method 100 of determining an overlay measurement process parameter. The method 100 may be used to determine one or more process parameters that are referred together, herein, as a recipe. The recipe may be an overlay metrology recipe such as, for example, used to define parameters of an optical scan of an optically readable target mark or pattern formed on layers of a substrate (e.g., semiconductor wafer) during a fabrication process for semiconductor devices. The overlay metrology recipe may be used to perform a scan that provides data useful to determine an offset between two or more layers formed on a semiconductor substrate. The recipe may include parameters associated with the imaging of patterns at high magnification. The images may then be digitized the images and processes using various image analysis algorithms including those discussed herein to determine any misalignment of the layers and/or quantify the overlay error.

The process parameters that may be determined using the method 100 may include the type of radiation source, for example, white, green, ivory, or yellow sources. The process parameters that may be determined using the method 100 may include the focus (e.g., depth of focus (DOF)). Other parameters include focus position, light illumination value (e.g., intensity, quantity, etc), scan time, scan rate, and/or other suitable parameters.

The method 100 begins at block 102 where a plurality of overlay measurement result maps and the corresponding quality indicators (e.g., quality indicator parameters or maps) are provided. Each measurement result map and/or set of quality indicators is associated with a scan of an overlay mark using a different recipe. In other words, the measurement result and/or quality indicator are illustrative of the same target overlay mark scanned under different conditions (e.g., different light source, different depth of focus, etc). The measurement result and/or quality indicator is illustrated for each of a plurality of points on the substrate (e.g., semiconductor wafer) thus, providing a map.

The quality indicator may be any indicator or data that can qualify or quantify the overlay measurement and provide a determination of whether its result is reliable. Quality indicators including precision, tool induces shift (TIS) 3 sigma, and/or tool-to-tool matching are known in the art. These indicators can describe the overlay performance. However, it is noted that they may not be sufficient to provide good overlay measurement. In other words, the total measurement uncertainty (TMU):

$$TMU = sqrt(Precision^2 + (TIS3\sigma)^2 + (Tool\ Matching)^2)$$

In an embodiment, the quality indicator includes the asymmetry index. The quality indicator may be a statistical parameter of an asymmetry measurement. Thus, in an embodiment, the quality indicator maps provide an asymmetry index(es) for each of a plurality of images, each image associated with different recipe. In an embodiment, a first quality indicator map is provided for a recipe having a white light source; a second quality indicator map is provided for a recipe having a green light source; a third quality indicator map is provided for a recipe having an ivory light source; and/or a fourth quality indicator map is provided for a recipe having a yellow light source. The asymmetry measurement may be calculated using methods described in the present disclosure, such as described with reference to FIG. 4, or other suitable methods.

Figure 2:
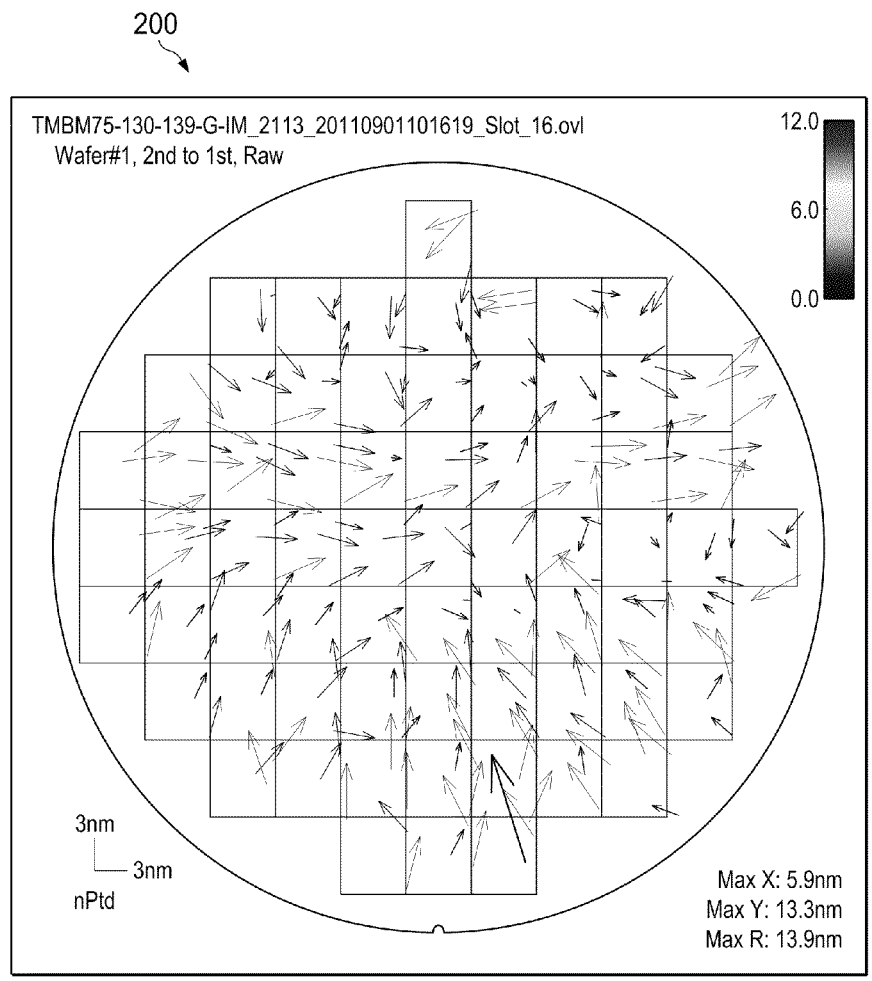
FIG. 2 is an exemplary embodiment of an overlay map used and/or generated by the method of FIG. 1.

The method 100 then proceeds to block 104 where a virtual overlay map is generated using the measurement result and/or quality indicator maps, described above with reference to block 102. FIG. 2 illustrates an exemplary embodiment of a virtual overlay map. The virtual overlay map may be constructed by comparing, on a point-by-point basis, the overlay measurements generated by image scanned under each of the different recipes. From this comparison, the best quality overlay measurement for each point is selected. The selection may be performed based on the quality indicator. The selected best quality overlay measurement for each point is then combined to provide a virtual overlay map. For example, the virtual overlay map may include a quality indicator and/or overlay measurement at each of a plurality of points on the substrate (e.g., semiconductor wafer). A first point of the plurality of points may be determined from a first recipe (e.g., an ivory light source). A second point of the plurality of points may be determined from a first recipe (e.g., a yellow light source), and so forth.

The method 100 then proceeds to block 106 where a similarity between the virtual overlay map, generated above with reference to block 104, and the overlay measurement maps generated by each recipe are compared. The comparison may be performed on a point-by-point basis. For example, for a first point on the virtual overlay map, the data of the virtual overlay map is compared with data generated by the overlay measurement using a first recipe at the same relative point. The data of the virtual overlay map is then compared with data generated by the overlay measurement using a second recipe at the same relative point. And so forth for each of the plurality of recipes. A similarity indicator is generated for each comparison. This is continued for each point on the virtual overlay map. The similarity indicator may include a suitable statistical analysis.

The method 100 then proceeds to block 108 where a recipe of the plurality of recipes is selected. The recipe selected may be the recipe that generates an overlay map (e.g., overlay measurements) that is most similar to the virtual overlay map. The similarity may be determined by any statistical measurement. In an embodiment, the selected recipe may be determined by comparing a center of symmetry (COS) for each of the plurality of recipes. In an embodiment, the selected recipe may be determined by comparing a measurement of a dimension (e.g., in nanometers).

The recipe selected may be referred to as the "optimum recipe". This nomenclature does not necessitate however that the recipe be an absolute optimum, but merely that it may provide a benefit over the other recipes in considering its accuracy of determining an overlay measurement. In other embodiments, other factors such as cost, efficiency, and the like may influence a designer's choice of an "optimal recipe". In an embodiment, the selected recipe may determine the preferred light source for radiation of the overlay target.

The method 100 may be used to provide for automatic recipe optimization in a semiconductor fabrication process, provide for in-line data analysis as a process parameter is varied, provide for a monitor of real-time variations of semiconductor fabrication processes (e.g., wafer-to-wafer variation, lot-to-lot variation), provide for an automated process control (APC) quality gate, provide for feedback to modify parameters of a scanner tool (e.g., APC), and/or provide other suitable advantages. One or more of these advantages is discussed below with reference to FIG. 18.

Figure 3:
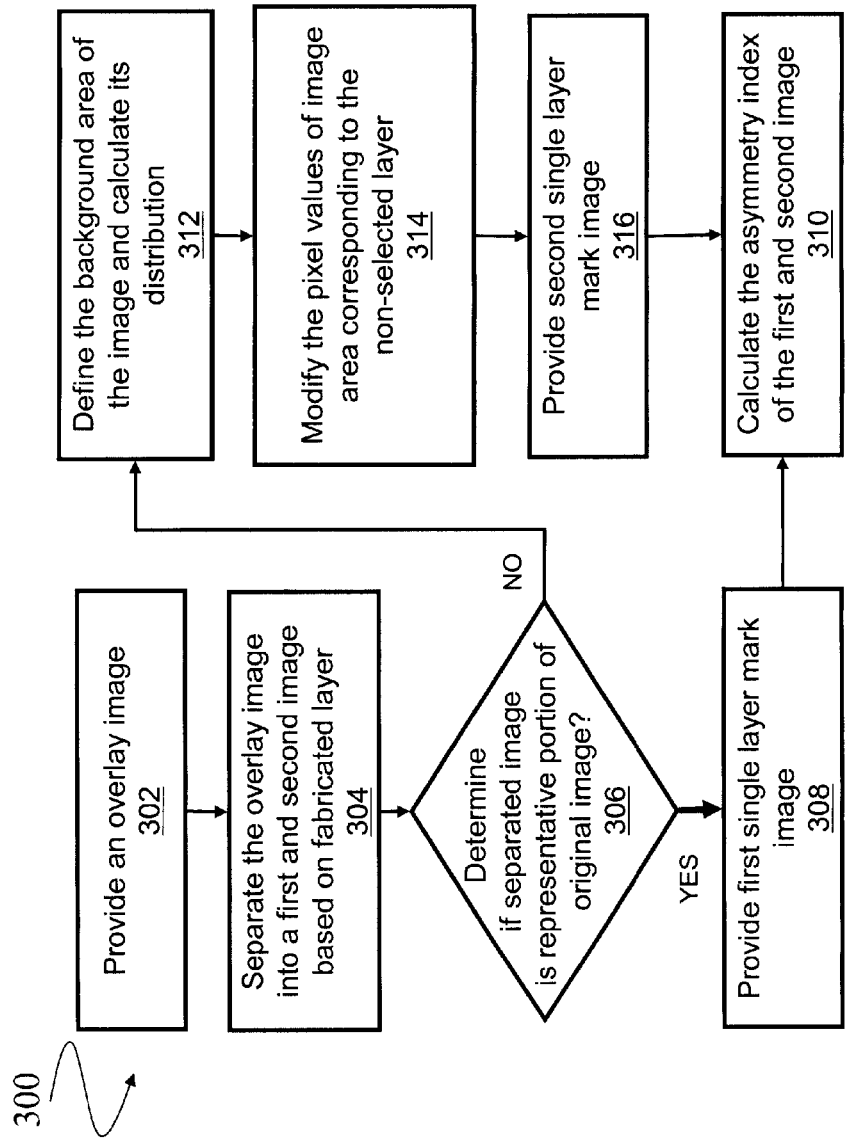
FIG. 3 is a flow chart illustrating an embodiment of a method of overlay measurement according to one or more aspects of the present disclosure.

Referring now to FIG. 3, illustrated is a method 300 of overlay measurement. The method 300 may be used to prepare an image of an overlay mark provided on a substrate and determine an overlay offset error provided by an overlay mark. FIGS. 5-12 provide exemplary embodiments of one or more steps of the method 300. It is noted that FIGS. 5-12 include representative overlay marks, but the method 300 is not limited to any specific configuration of overlay mark (e.g., box-in-box, frame-in-frame, cross-in-box, etc).

The method 300 begins at block 302 where an overlay image is provided. The overlay image may a digitized image of an overlay mark, also referred to as an alignment mark or target, provided on a substrate such as a semiconductor wafer. The image may be obtained by radiating or scanning the substrate with a light source and determining an image (e.g., based on reflection of the radiation). The scan may include an optical scan of an optically readable target mark or pattern formed on layers of a substrate (e.g., semiconductor wafer) during a fabrication process for semiconductor devices. The overlay mark may include a feature formed on a first layer of the substrate, and a second layer formed on a second layer of the substrate. It is noted that the layers may be sequential or one or more layers may interpose the target layers. The scan of the overlay mark provides data useful to determine an offset between the first and second layers (or any plurality of layers) formed on a semiconductor substrate.

Referring to the example of FIG. 5, an overlay image 500 of an overlay mark (e.g., a box-in-box mark) formed on a substrate is illustrated. The overlay image includes a first feature 502 and a second feature 504. The overlay image 500 may be representative of a box-in-box target. In an embodiment, the first feature 502 is an image representative of a feature formed on a first layer of a substrate. In an embodiment, the second feature 504 is an image representative of a feature formed on a second layer of a substrate. The overlay image 500 may be generated from an optical scan of the substrate.

Figure 9:
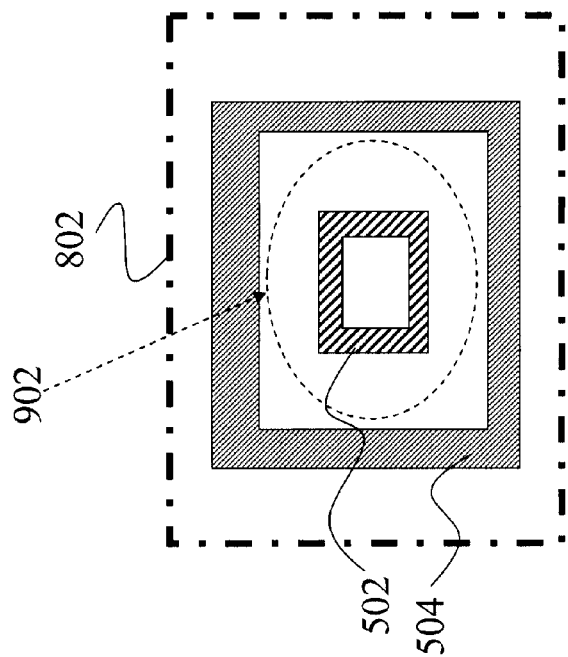
Figure 8:
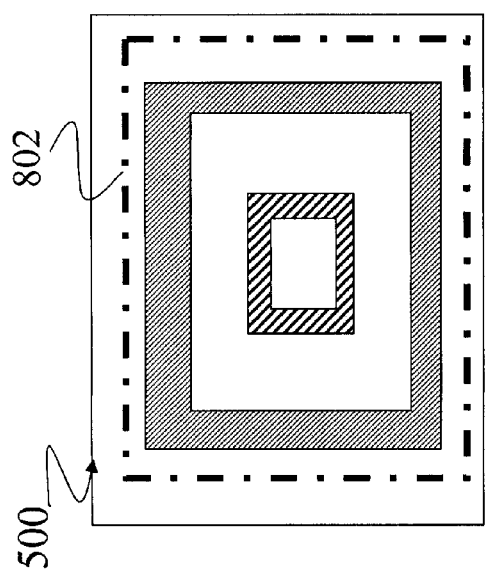

The method 300 then proceeds to block 304 where the overlay image, described above with reference to block 302, is separated into a plurality of images. One image is generated for each fabrication layer of the substrate. It is noted that two layers are described herein, however, any plurality of layers are possible. Referring to the example of FIGS. 6, 7, 8, and 9, the image 500 is separated into two images. FIG. 6 illustrates the image 500 having a first image 602 designated and selected. The image 602 includes feature 502, which is an image of a corresponding feature formed on a first layer of a semiconductor substrate. FIG. 7 illustrates the first image 602 separated. FIG. 8 illustrates the image 500 having a second image 802 designated and selected. The image 602 is associated with and includes feature 504, which is an image of a corresponding feature formed on a second layer of a semiconductor substrate. FIG. 9 illustrates the second image 802 separated. It is noted that the second image 802 includes an unwanted portion or image, that is, an image representative of a feature on a non-selected layer. This unwanted image is denoted 902 (e.g., feature 504) and is discussed in further detail below.

The method 300 then proceeds to block 306 where for each separated image it is determined if the image is representative of the original image. In other words, it is determined if the selected image is a reproduction of a contiguous portion of the original image without the inclusion of unwanted features. A separated image that is not representative of the original image is an image that includes an unwanted portion or image from the original image that is not representative of features on the a single selected layer. Referring to the example of FIG. 7, the first image 602 is representative of the original image, image 500. Thus, with respect to the first image 602, the method 300 proceeds to block 308. Referring to the example of FIG. 9, the second image 802 is not representative of the original image, image 500. The second image 802, which is intended to be an image of features of a second layer of the substrate, includes a region having an unwanted feature 902. The unwanted feature 902 includes a feature that is representative of features of a first, and different, layer of the substrate (e.g., 502). Thus, with respect to the second image 802, the answer to block 306 is NO; the separated image (e.g., 802) is not a representative portion of the original image, but includes unwanted features. Thus, for the second image 802, the method 300 proceeds to block 312.

If the separated image is representative of the original image (e.g., the separated image includes a portion of the original image in total without unwanted features), then for that image, the method 300 proceeds to block 308. As described above, for the first image 602 the method 300 proceeds to block 308 where a first single layer overlay mark image is provided. Continuing to refer to the example of FIG. 7, the first single layer overlay mark image 702 is provided.

After block 308, the method 300 proceeds to block 310 where an asymmetry index (AI) is calculated for the image provided in block 308. Referring to the example of FIG. 7, one or more AI indicators are calculated from the first single layer overlay mark image 702.

Returning to block 306, if the separated image is not representative of the original image the method proceeds to block 312. A separated image that is not representative of the original image is an image desired to be of a single layer that includes an unwanted portion or image from the original image but that is not representative of an image of the single selected layer (e.g., images of features on other layers). As described above, for the second image 802, the method 300 proceeds to block 312 as the second image 802 is not representative of the desired portion of the original image.

In block 312, a background area of the image including an unwanted feature is defined. The background area may be a region of the image without an image feature (e.g., an image representative of a feature formed on the substrate). In an embodiment, the background area includes a region adjacent to, but not including, the unwanted image feature(s). A plurality of values associated background image region is then determined. In an embodiment, the plurality of values determined include pixel values (e.g., how bright a given pixel is and/or what color it is). In an embodiment, the pixel values correspond to varying shades of gray in the image. After determining the plurality of values associated with the defined background region, a distribution of the values is prepared.

Figure 10A:
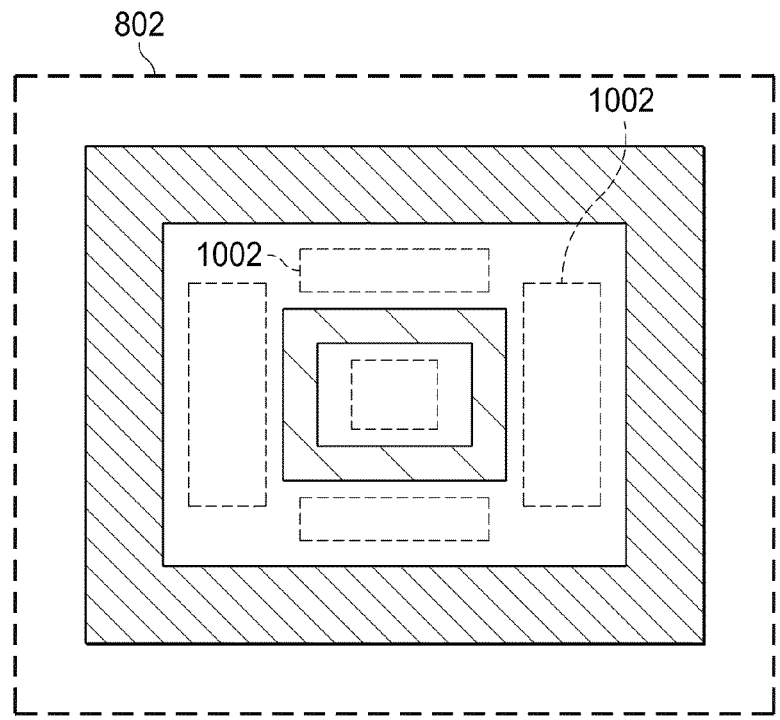
Figure 10B:
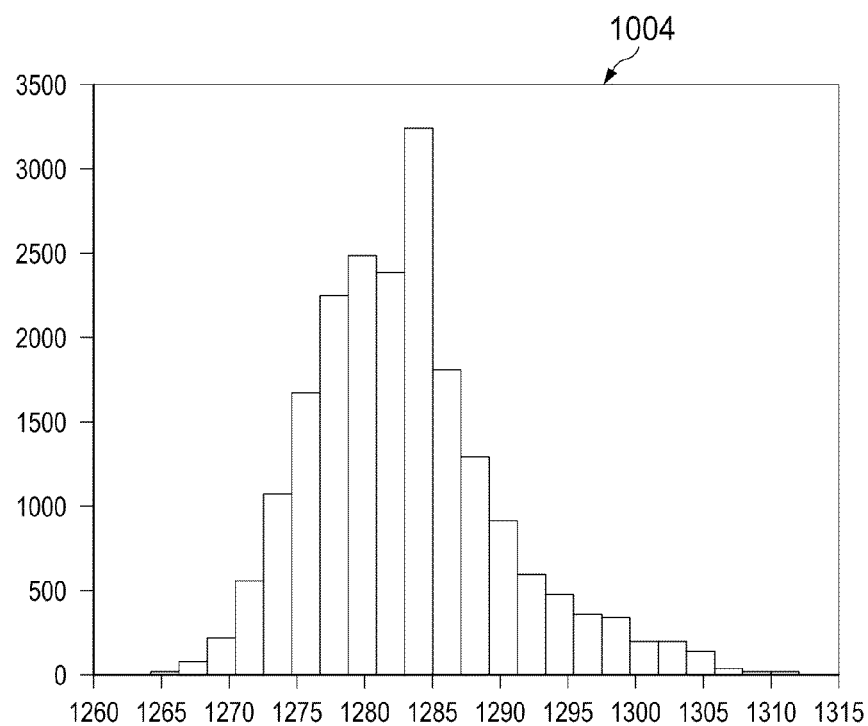
FIG. 10b is a histogram generated according to one or more steps of the method of FIG. 3.
Figure 13:
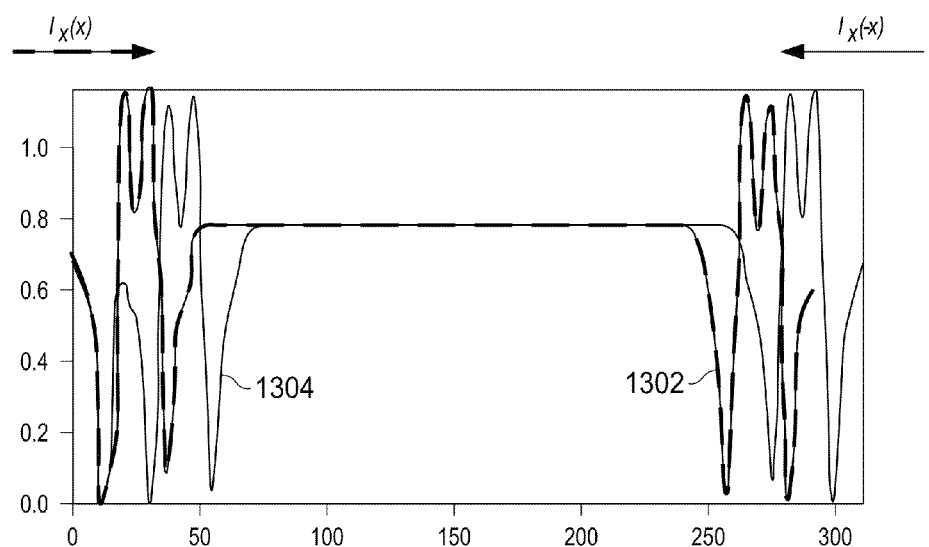
FIGS. 13, 14, 15, 16, and 17 are graphs generated according to one or more aspects of the method of FIG. 4.

Referring to the example of FIG. 10a, background areas 1002 are determined and defined. A value, e.g., pixel value, is determined for various points within the background areas 1002. The determined pixel values are then plotted to provide a distribution of pixel values. Referring to the example of FIG. 10b, a distribution 1004 is illustrated, which indicates a distribution of the pixel values in the background areas 1002. The distribution 1004 may include a count (e.g., y-axis) of pixels having a given value (e.g., x-axis).

The method 300 then proceeds to block 314 wherein the pixel values of the image area corresponding to the unwanted image (representing the non-selected layer) are identified and modified. The pixel values of the unwanted image may be modified (e.g., randomly) according to the distribution of the background area, described above with reference to block 312. Thus, the unwanted image is removed from the image and transformed into a region representing a background area.

Referring to the example of FIG. 11, which is continuing from FIGS. 8 and 9, a region 1102 including the unwanted feature 902 is defined. The pixel values of this region 1102 are modified. The pixel values are modified in region 1102 such that they are representative of the distribution 1004 of FIG. 10b. After modification of the pixel values, the image 1202 is provided. The image 1202 includes the image feature 504, which is representative of a feature formed on a second layer of the substrate. It is noted that the image 1202 no longer includes an unwanted feature (e.g., an image representing a feature formed on another layer of the substrate).

The method 300 then proceeds to block 316 wherein the second single layer mark image is provided. Referring to the example of FIG. 12, the second single layer mark image 1202 is provided. Thus, the method 300 provides a first and second image, each image representative of features of an overlay mark formed on a single layer of the semiconductor substrate (e.g., images 702 and 1202).

After the image is prepared in block 316, the method 300 then proceeds to block 310 where an asymmetry index (AI) is calculated for the second image. Referring to the example of FIG. 12, one or more AI indicators are calculated from the second single layer overlay mark image 1202. Thus, in block 310 an asymmetry index or indexes are calculated for each of an image representing a first layer and an image representing a second layer of the overlay mark. The AI may be calculated as discussed below with reference to FIG. 4, and/or other suitable methods.

Figure 4:
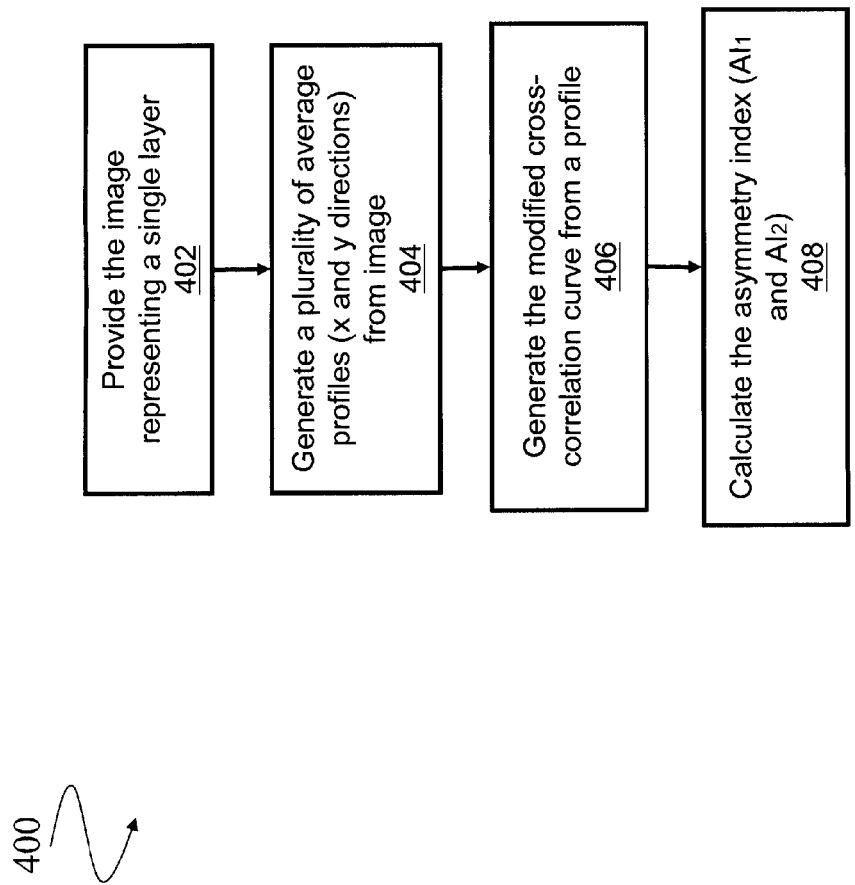
FIG. 4 is a flow chart illustrating an embodiment of a method of calculating an asymmetry index according to one or more aspects of the present disclosure.

Referring now to FIG. 4, illustrated is a method 400 of calculating an asymmetry index (AI) of an overlay mark. In an embodiment, the method 400 may be implemented in block 310 of the method 300. In an embodiment, the method 400, or portion thereof, may be implemented in the method 100. FIGS. 13, 14, 15, 16, and 17 are exemplary graphical representations of the data gathered and/or produced in the method 400.

The method 400 begins at block 402 wherein an image is provided that represents features of a single layer formed on a substrate (e.g., semiconductor wafer). The single layer image may be substantially similar to as discussed above with reference to block 308 and/or 316 of the method 300, described in FIG. 3.

The method 400 then proceeds to block 404 where a plurality of average profiles are generated from the image of block 402. In an embodiment, the average profiles include a profile in the x-direction and a profile in the y-direction. The direction may be representative of the scan direction. The average profile may include a measurement of the light intensity of the image along a scan line. An inverse profile of each the plurality of average profiles may also be generated. Referring to the example of FIG. 13, a profile 1300 provided in the x-direction along a scan line of an image is provided. The image may be representative of a features of a single layer formed on the substrate. The line 1302 is representative of the light intensity as measured by the scan along the scan line. The line 1304 is an inverse profile (e.g., of line 1402). Though the profile 1300 is representative of an x-direction scan, the y-direction scan may be represented in a substantially similar manner.

The method 400 then proceeds to block 406 where the modified cross-correlation curve is generated. A modified cross-correlation curve may be generated from one profile (e.g., x-direction) and its inverse profile. A second modified cross-correlation cure may be generated for another of the plurality of profiles (e.g., y-direction) and its associated inverse profile. The modified cross-correlation curve may be generated according to the equation (representing the x-direction):

$$C_x(x) = \frac{1}{N-1} \sum_x \frac{[I_x(x) - \overline{BG}][I_x(-x) - \overline{BG}]}{\sigma_x^2}$$

wherein BG provides a background parameter. Referring to the example of FIG. 14, a cross-correlation curve 1400 is provided. The cross-correlation curve 1400 may provide the Cx value on a y-axis and a reflectivity or brightness determined by the average profile on an x-axis. While the cross-correlation curve 1400 illustrates a cross-correlation curve generated from data from an x-direction scan, a similar curve may be generated from a y-direction scan (and the corresponding average profile in the y-direction such as described above with reference to block 404).

The method 400 then proceeds to block 408 where an asymmetry index is calculated for the overlay image. In an embodiment, two AI are calculated for each of the plurality of scans of the image (e.g., two AI values for the x-direction scan and two AI values for the y-direction scan).

The first AI value may be calculated directly from the cross-correlation curve. Specifically, the cross-correlation curve includes a point that may be used to calculate an AI value associated with the overlay image. In an embodiment, the maximum point on the curve (e.g., the max Cx or max Cy) may be used to determine a first AI value, for example, continuing with the example of the x-direction scan:

$$AI_1 = (1 - \max\{C_x\}) \times 10$$

Figure 14:
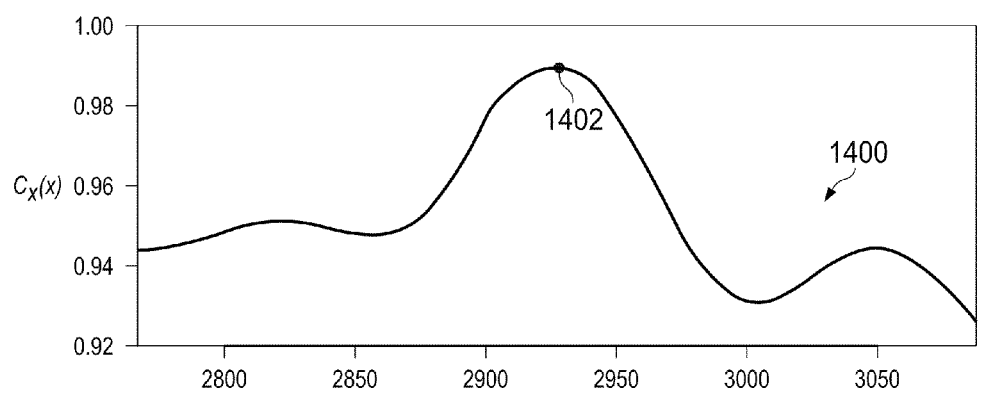
Figure 16:
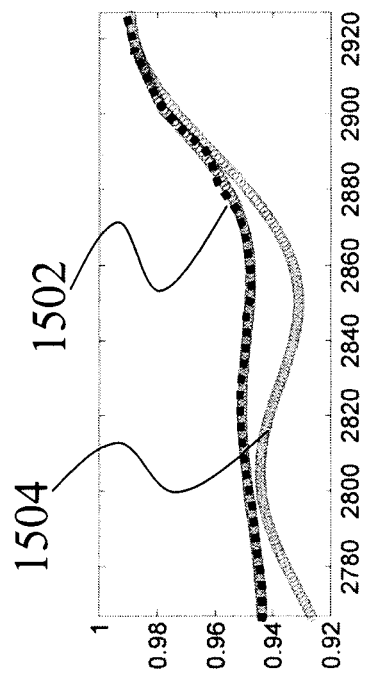

Referring to the example of FIG. 14, a point 1402 is provided on the cross-correlation curve 1400 which indicates max Cx. Using the equation noted above, a first AI value may be obtained. This first AI value may be calculated for each of the scans of the overlay image (e.g., for each direction, each scan line, and/or each average profile).

Figure 15:
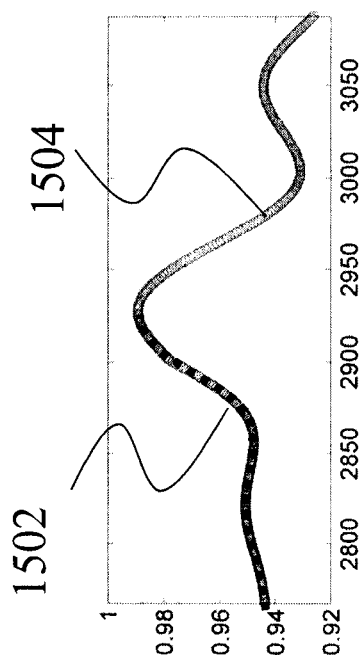
Figure 17:
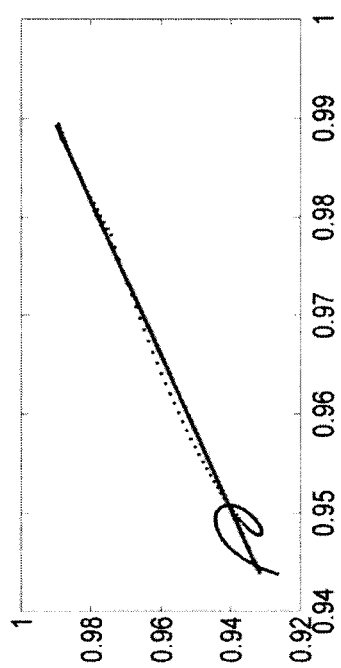

In an embodiment, a second AI value may be calculated. First, the left and right portion of each of the generated and normalized cross-correlation curves may be defined. Referring to the example of FIG. 15, illustrated is the normalized cross-correlation curve 1400 having a left portion 1502 and a right portion 1504 defined. After defining the left/right portion of the normalized cross-correlation curve, one of the portions is inversed (e.g., the right portion). Referring to the example of FIG. 16, the right portion 1504, illustrated in FIG. 15, has been inversed to form line 1602. After inverting one portion, the left and right portions of the cross-correlation curve are graphed against one another. Referring to the example of FIG. 17, the right portion is graphed on the y-axis and the left portion is graphed on the x-axis for each reflective value. A line 1702 is fit to the data points. From this line, the second AI value may be calculated. For example, $$AI_2 = (1 - R^2) \times 10$$

Thus, $AI_2$ is provided by the R-square value of the left and right side points.

Thus, a first and second AI may be calculated for a given scan of an overlay image. For example, for an x-direction scan an $AI_1$ and an $AI_2$ may be calculated as described above. $AI_1$ may be provided by the maximum value of the modified cross-correlation curve. $AI_2$ may be provided by the R-square value of the left and ride side points of the normalized cross-correlation curve. The method 400 may continue to provide the calculation of $AI_1$ and $AI_2$ for another scan, for example, a y-direction scan.

In an embodiment, a first and second AI may be calculated for each separated portion of an overlay image. For example, AI(s) may be calculated using the method 400 for an image representative of a first layer of an overlay mark and an AI(s) may be calculated using the method 400 for a second image representative of a second layer of an overlay mark.

Figure 18:
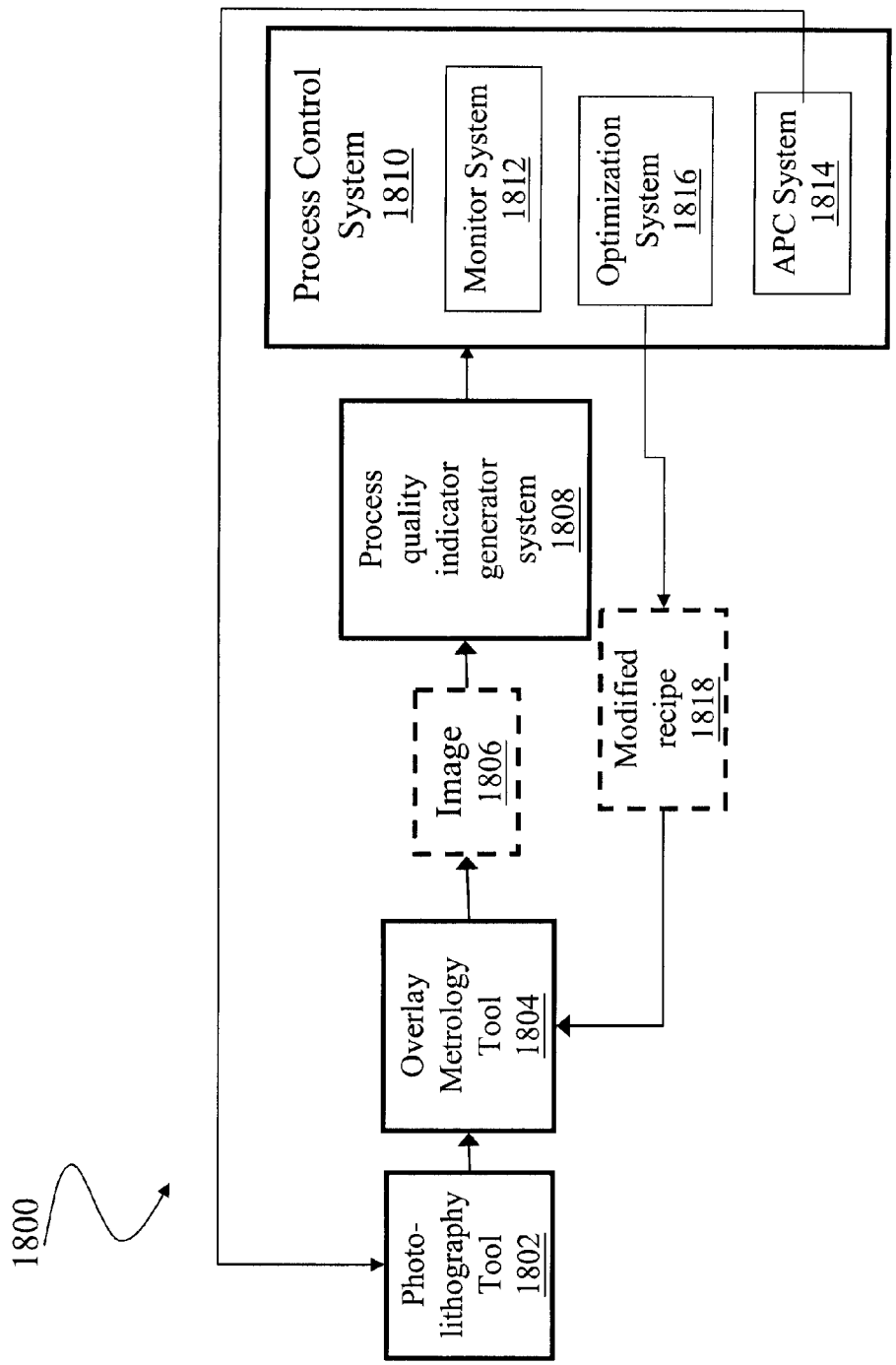
FIG. 18 is block diagram illustrating a system of tools for semiconductor device fabrication process and information flow in the system according to one or more aspects of the present disclosure.

The block diagram of FIG. 18 provides on exemplary implementation of a system 1800 of semiconductor device fabrication. A photolithography tool 1802 such as an exposure tool (e.g., stepper or scanner) 1802 is provided. The photolithography tool 1802 aligns a photomask with a substrate and projects an image onto the substrate. The photolithography tool 1802 may project an overlay mark image, or portion thereof, onto the substrate. Using suitable photolithography processes, the overlay mark is fabricated onto one or more layers of the semiconductor substrate.

In an embodiment, after imaging by the photolithography tool 1802, the substrate is moved to an overlay metrology tool 1804. The overlay metrology tool 1804 may be operable to provide optical scan of an optically readable target mark or pattern formed on layers of a substrate by the photolithography tool 1802 (and other semiconductor processes). The overlay metrology tool 1804 may include a camera operable to scan and generate an image.

The overlay metrology tool 1804 generates an image 1806 of the overlay mark formed on the substrate. The image may be substantially similar to as discussed above with reference to block 302 of the method 300 and/or block 102 of the method 100.

From the image 1706, the system 1800 includes a process quality indicator system 1808. The system 1808 may the implement a method such as described above with reference to the method 300 and/or the method 400 to provide a process quality indicator or indicators. In an embodiment, the process quality indicator system 1808 generates an asymmetry index (AI). The process quality indicator system 1808 may include an information handling system such as, the system 1900 described below with reference to FIG. 19. In an embodiment, the process quality indicator system 1808 includes a computer readable medium that includes instructions for performing the methods of FIGS. 1, 3, and/or 4 or portions thereof.

The output quality indicator from the quality indicator calculation system 1808 may delivered to a process control system 1810. The process control system 1810 may include a monitor system 1812 used to monitor the fabrication process. For example, a monitoring system 1812 of the process control system 1810 may include information handling systems such as the system 1900 described below with reference to FIG. 19. In an embodiment, the monitoring system 1812 may provide for material disposition. For example, if the determined overlay error (e.g., as output from the quality indicator system 1808 and the metrology tool 1804) exceeds a given allowable threshold or control limit (e.g., for the allowable overlay error of the process), material (e.g., lot or wafer) may be held for engineering review, reworked, scrapped, and/or other suitable corrective actions.

The process control system 1810 may further include an automated process control (APC) system 1814. For example, the APC system 1814 of the process control system 1810 may include an information handling system such as the system 1900 described below with reference to FIG. 19. In an embodiment, the APC system 1814 may provide for feedback of process performance data (e.g., as output from the quality indicator system 1808 and the metrology tool 1804) to the photolithography tool 1802 such that processing of the photolithography tool 1802 may be improved or otherwise changed (e.g., recipe parameters may be adjusted).

The process control system 1810 may further include a recipe optimization system 1816. For example, the optimization system 1816 of the process control system 1810 may include information handling systems such as the system 1900 described below with reference to FIG. 19. In an embodiment, the optimization system 1816 may provide for feedback of process performance data (e.g., as output from the quality indicator system 1808 and the metrology tool 1804) to the overlay metrology tool 1802 such that the scan recipe may be altered to provide improved performance. In an embodiment, the optimization system 1816 determines an optimization to the overlay metrology tool using a method substantially similar to the method 100, described above with reference to FIG. 1. The optimization system 1816 may output an optimized recipe 1818 to the overlay metrology tool 1804. It is noted that one of more of the systems included in the process control system 1810 may be performed by a single system.

Figure 19:
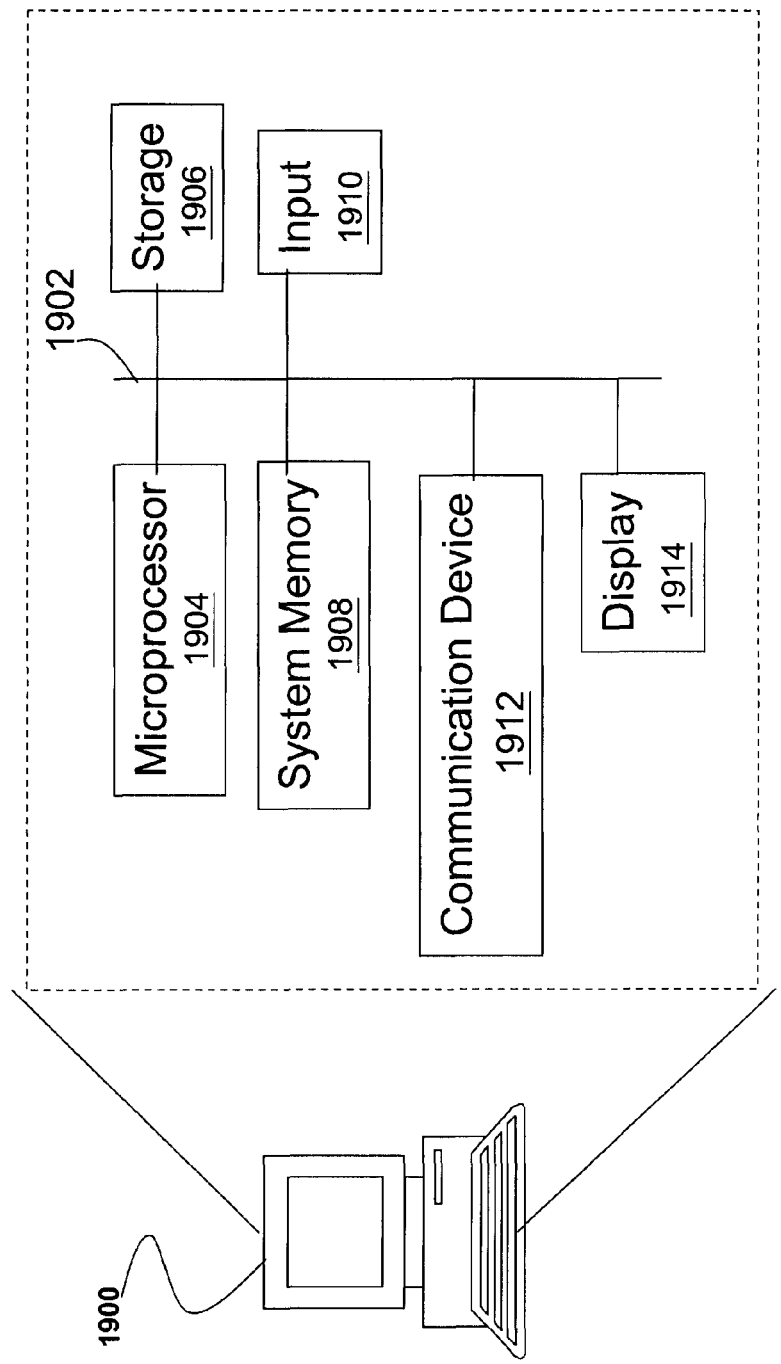
FIG. 19 is a block diagram of an information handling system that is operable to perform one or more of the aspects of the present disclosure.

One system for providing the disclosed embodiments of the methods 100, 300 and/or 400 and/or of the system 1800 is illustrated in FIG. 19. Illustrated is an embodiment of an information handling system 1900 for implementing embodiments of the present disclosure including the systems and methods described herein. In an embodiment, the computer system 1900 includes functionality providing for one or more steps of the methods of scanning substrates, providing images, separating images, analyzing images, calculating values, and the like described above with reference to FIGS. 1-18.

The information handling system 1900 includes a microprocessor 1904, an input device 1910, a storage device 1906, a system memory 1908, a display 1914, and a communication device 1912 all interconnected by one or more buses 1902. The storage device 1906 may be a floppy drive, hard drive, CD-ROM, optical device or any other storage device. In addition, the storage device 1906 may be capable of receiving a floppy disk, CD-ROM, DVD-ROM, or any other form of computer-readable medium that may contain computer-executable instructions. The communications device 1912 may be a modem, a network card, or any other device to enable the computer system to communicate with other nodes. It is understood that any computer system 1900 could represent a plurality of interconnected computer systems such as, personal computers, mainframes, smartphones, and/or other telephonic devices.

The computer system 1900 includes hardware capable of executing machine-readable instructions as well as the software for executing acts (typically machine-readable instructions) that produce a desired result. Software includes any machine code stored in any memory medium, such as RAM or ROM, and machine code stored on other storage devices (such as floppy disks, flash memory, or a CD ROM, for example). Software may include source or object code, for example. In additional software encompasses any set of instructions capable of being executed in a client machine or server. Any combination of hardware and software may comprise an information handling system. The system memory 1908 may be configured to store a design database, algorithms, images, graphs, and/or other information.

Computer readable medium includes non-transitory medium. Computer readable mediums include passive data storage, such as RAM as well as semi-permanent data storage such as a compact disk read only memory (CD-ROM). In an embodiment of the present disclosure may be embodied in the RAM of a computer to transform a standard computer into a new specific computing machine. Data structures are defined organizations of data that may enable an embodiment of the present disclosure. For example, a data structure may provide an organization of data, or an organization of executable code. Data signals could be carried across transmission mediums and store and transport various data structures, and thus, may be used to transport an embodiment of the present disclosure.

The computer system 1900 may be used to implement one or more of the methods and/or systems described herein. In particular, the computer system 1900 may be operable to generate, store, manipulate, analyze, and/or perform other actions on an image associated with an overlay target formed on a semiconductor device. For example, in an embodiment, one or more of the graphs described above (FIGS. 13-17) may be generated, manipulated, and/or stored using the computer system 1900. For example, in an embodiment, one or more of the images described above (FIGS. 2, 5-12) may be generated, manipulated, and/or stored using the computer system 1900. In other embodiments, portions of the computer system 1400 are operable to receive, generate, store, or compute equations or data relating to the system 1800, method 100, method 300, and/or method 400, described herein.

In summary, the methods and systems disclosed herein provide for measurement of overlay error. In doing so, embodiments of the present disclosure offer certain advantages. Advantages include the development of an improved overlay measurement recipe based on a quality indicator. An improved manner of calculating a quality indictor is also provided by splitting an image of an overlay mark into separate layers. This allows for the plurality of layers to be separately analyzed without interference with one another. One quality indicator is an asymmetry index. The asymmetry index is provided that includes two different definitions generated from a cross-correlation curve. It is understood that different embodiments disclosed herein offer different disclosure, and that they may make various changes, substitutions and alterations herein without departing from the spirit and scope of the present disclosure.

What is claimed is:

1. A method of determining overlay error in semiconductor device fabrication, the method comprising:

receiving an image of an overlay mark formed on a substrate;

separating the image into a first image and a second image, wherein the first image includes an image of features formed on a first layer of the substrate and the second image includes an image of the features formed on a second layer of the substrate;

after separating the image into the first and second images, defining a background area of the second image;

determining a distribution of pixel values for the background area;

altering the pixel values for an unwanted portion of the second image according to the distribution of the pixel values for the background area;

determining a quality indicator for the first image; and determining a quality indicator for the second image.

2. The method of claim 1, wherein the quality indicator for the first image includes an asymmetry index (AI).

3. The method of claim 1, wherein the unwanted portion includes an image of a feature formed on a non-selected layer of the substrate.

4. The method of claim 1, wherein the unwanted portion includes an image of a feature formed on the first layer of the substrate.

5. The method of claim 1, wherein the overlay mark is a box-in-box mark, and wherein the first image includes an inner box of the box-in-box mark and the second image includes an outer box of the box-in-box mark.

6. A method of determining overlay error in semiconductor device fabrication, the method comprising:

receiving an image of an overlay mark formed on a substrate;

separating the image into a first image and a second image, wherein the first image includes an image of features formed on a first layer of the substrate and the second image includes an image of the features formed on a second layer of the substrate;

determining a quality indicator for the first image; wherein the determining the quality indicator for the first image includes:

providing an average profile of the first image and an inverse of the average profile;

generating a cross-correlation curve from the average profile and the inverse of the average profile; and calculating a first asymmetry index (AI) and a second AI using the cross-correlation curve; and determining a quality indicator for the second image.

7. The method of claim 6, wherein the calculating the first AI includes:

locating a maximum point on the cross-correlation curve.

8. The method of claim 7, wherein the calculating the second AI includes:

separating the cross-correlation curve into a first portion and a second portion;

inversing the second portion; and fitting a line to a graph of the first portion against the second portion.

9. A method of determining overlay error in semiconductor device fabrication, the method comprising:

receiving an image of an overlay mark formed on a substrate;

separating the image into a first image and a second image, wherein the first image includes an image of features formed on a first layer of the substrate and the second image includes an image of the features formed on a second layer of the substrate; and determining a quality indicator for the first image; wherein the determining the quality indicator for the first image includes:

providing an average profile of the first image and an inverse of the average profile;

generating a cross-correlation curve from the average profile and the inverse of the average profile; and calculating a first asymmetry index (AI) and a second AI using the cross-correlation curve.

10. The method of claim 9, wherein the quality indicator includes an asymmetry index (AI).

11. The method of claim 9, further comprising:

after separating the image into the first and second images, defining a background area of the second image;

determining a distribution of pixel values for the background area; and altering the pixel values for an unwanted portion of the second image according to the distribution of the pixel values for the background area.

12. The method of claim 11, wherein the unwanted portion includes an image of a feature formed on a non-selected layer of the substrate.

13. The method of claim 11, wherein the unwanted portion includes an image of a feature formed on the first layer of the substrate.

14. The method of claim 9, wherein the calculating the first AI includes locating a maximum point on the cross-correlation curve, and wherein the calculating the second AI includes:

separating the cross-correlation curve into a first portion and a second portion;

inversing the second portion; and fitting a line to a graph of the first portion against the second portion.

15. The method of claim 1, wherein the determining the quality indicator for the first image includes:

providing an average profile of the first image and an inverse of the average profile;

generating a cross-correlation curve from the average profile and the inverse of the average profile; and calculating a first asymmetry index (AI) and a second AI using the cross-correlation curve.

16. The method of claim 15, wherein the calculating the first AI includes:

locating a maximum point on the cross-correlation curve.

17. The method of claim 16, wherein the calculating the second AI includes:

separating the cross-correlation curve into a first portion and a second portion;

inversing the second portion; and fitting a line to a graph of the first portion against the second portion.

18. The method of claim 6, further comprising:

after separating the image into the first and second images, defining a background area of the second image;

determining a distribution of pixel values for the background area; and altering the pixel values for an unwanted portion of the second image according to the distribution of the pixel values for the background area.

19. The method of claim 18, wherein the unwanted portion includes at least one of an image of a feature formed on a non-selected layer of the substrate and an image of a feature formed on the first layer of the substrate.

20. The method of claim 6, wherein the overlay mark is a box-in-box mark, and wherein the first image includes an inner box of the box-in-box mark and the second image includes an outer box of the box-in-box mark.

* * * * *